(12) United States Patent
Khlat

(10) Patent No.: US 10,778,151 B2
(45) Date of Patent: *Sep. 15, 2020

(54) MULTI-MODE POWER MANAGEMENT SYSTEM SUPPORTING FIFTH-GENERATION NEW RADIO

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,121

(22) Filed: Dec. 12, 2018

(65) Prior Publication Data

US 2019/0115873 A1   Apr. 18, 2019

Related U.S. Application Data

(63) Continuation of application No. 15/678,245, filed on Aug. 16, 2017, now Pat. No. 10,171,037.

(Continued)

(51) Int. Cl.
*H03F 3/68* (2006.01)
*H03F 1/02* (2006.01)
(Continued)

(52) U.S. Cl.
CPC ......... *H03F 1/0222* (2013.01); *H03F 1/0227* (2013.01); *H03F 1/0288* (2013.01);
(Continued)

(58) Field of Classification Search
CPC ................................ H03F 1/0288; H03F 3/68
(Continued)

(56) References Cited

U.S. PATENT DOCUMENTS 5,959,515 A   9/1999 Cornett et al.
6,434,122 B2   8/2002 Barabash et al.
(Continued)

OTHER PUBLICATIONS

Ex Parte Quayle Action for U.S. Appl. No. 15/678,245, mailed Jun. 6, 2018, 4 pages.
(Continued)

*Primary Examiner* — Steven J Mottola
(74) *Attorney, Agent, or Firm* — Withrow & Terranova, P.L.L.C.

(57) ABSTRACT

Embodiments of the disclosure relate to a multi-mode power management system supporting fifth-generation new radio (5G-NR). The multi-mode power management system includes first tracker circuitry and second tracker circuitry each capable of supplying an envelope tracking (ET) modulated or an average power tracking (APT) modulated voltage. In examples discussed herein, the first tracker circuitry and the second tracker circuitry have been configured to support third-generation (3G) and fourth-generation (4G) power amplifier circuits in various 3G/4G operation modes. The multi-mode power management system is adapted to further support a 5G-NR power amplifier circuit(s) in various 5G-NR operation modes based on the existing first tracker circuitry and/or the existing second tracker circuitry. In this regard, the 5G-NR power amplifier circuit(s) can be incorporated into the existing multi-mode power management system with minimum hardware changes, thus enabling 5G-NR support without significantly increasing component count, cost, and footprint of the multi-mode power management system.

20 Claims, 6 Drawing Sheets

Related U.S. Application Data

(60) Provisional application No. 62/489,727, filed on Apr. 25, 2017.

(51) Int. Cl.

| | | |
|---|---|---|
| *H03F 1/56* | (2006.01) | |
| *H03F 3/19* | (2006.01) | |
| *H03F 3/24* | (2006.01) | |
| *H03F 3/21* | (2006.01) | |
| *H03F 3/72* | (2006.01) | |
| *H04B 1/04* | (2006.01) | |

(52) U.S. Cl.
CPC ............... *H03F 1/56* (2013.01); *H03F 3/19* (2013.01); *H03F 3/211* (2013.01); *H03F 3/245* (2013.01); *H03F 3/68* (2013.01); *H03F 3/72* (2013.01); *H04B 1/0483* (2013.01); *H03F 2200/102* (2013.01); *H03F 2200/105* (2013.01); *H03F 2200/111* (2013.01); *H03F 2200/222* (2013.01); *H03F 2200/387* (2013.01); *H03F 2200/451* (2013.01); *H03F 2203/7209* (2013.01); *H04B 1/04* (2013.01)

(58) Field of Classification Search
USPC ................................................. 330/136, 295
See application file for complete search history.

(56) References Cited

U.S. PATENT DOCUMENTS

| | | | |
|---|---|---|---|
| 6,853,286 | B2 | 2/2005 | Iwakata et al. |
| 8,008,970 | B1 | 8/2011 | Homol et al. |
| 8,571,498 | B2 | 10/2013 | Khlat |
| 8,909,175 | B1 | 12/2014 | McCallister |
| 9,112,452 | B1 | 8/2015 | Khlat |
| 9,247,496 | B2 | 1/2016 | Khlat |
| 9,401,678 | B2 | 7/2016 | Kay et al. |
| 9,484,865 | B2 | 11/2016 | Kobayashi et al. |
| 10,171,037 | B2 * | 1/2019 | Khlat .................... H03F 1/0227 |
| 2006/0244513 | A1 | 11/2006 | Yen et al. |
| 2009/0045877 | A1 | 2/2009 | Wang et al. |
| 2010/0219887 | A1 | 9/2010 | Ichitsubo et al. |
| 2010/0283534 | A1 | 11/2010 | Pierdomenico |
| 2012/0062205 | A1 | 3/2012 | Levesque et al. |
| 2012/0176196 | A1 | 7/2012 | Khlat |
| 2012/0212316 | A1 | 8/2012 | Cho |
| 2012/0281597 | A1 | 11/2012 | Khlat et al. |
| 2013/0043557 | A1 | 2/2013 | Cho |
| 2013/0141064 | A1 | 6/2013 | Kay et al. |
| 2013/0141068 | A1 | 6/2013 | Kay et al. |
| 2013/0165132 | A1 | 6/2013 | Goedken et al. |
| 2013/0285750 | A1 | 10/2013 | Chowdhury et al. |
| 2013/0307617 | A1 | 11/2013 | Khlat et al. |
| 2014/0062590 | A1 | 3/2014 | Khlat et al. |
| 2014/0105327 | A1 | 4/2014 | Geng et al. |
| 2014/0225674 | A1 | 8/2014 | Folkmann et al. |
| 2015/0091653 | A1 | 4/2015 | Kobayashi et al. |
| 2015/0180422 | A1 | 6/2015 | Khlat et al. |
| 2015/0234402 | A1 | 8/2015 | Kay et al. |
| 2015/0349724 | A1 | 12/2015 | Wang et al. |
| 2016/0079165 | A1 | 3/2016 | Mei et al. |
| 2016/0164476 | A1 | 6/2016 | Wang et al. |
| 2016/0181995 | A1 * | 6/2016 | Nentwig ................ H03F 3/211 330/295 |
| 2016/0233580 | A1 | 8/2016 | Aparin et al. |
| 2017/0124013 | A1 | 5/2017 | Vaillancourt et al. |
| 2018/0205347 | A1 | 7/2018 | Das et al. |
| 2018/0351454 | A1 | 12/2018 | Khesbak et al. |

OTHER PUBLICATIONS

Notice of Allowance for U.S. Appl. No. 15/825,562, dated Jun. 11, 2018, 8 pages.
Notice of Allowance for U.S. Appl. No. 15/830,686, dated May 24, 2018, 8 pages.
Notice of Allowance for U.S. Appl. No. 15/837,496, dated May 25, 2018, 8 pages.
Non-Final Office Action for U.S. Appl. No. 15/836,334, dated Nov. 30, 2018, 5 pages.
Notice of Allowance for U.S. Appl. No. 15/939,406, dated Feb. 4, 2019, 6 pages.
Notice of Allowance for U.S. Appl. No. 15/720,894, dated Sep. 11, 2019, 10 pages.
Non-Final Office Action for U.S. Appl. No. 15/856,143, dated Mar. 26, 2020, 13 pages.

* cited by examiner

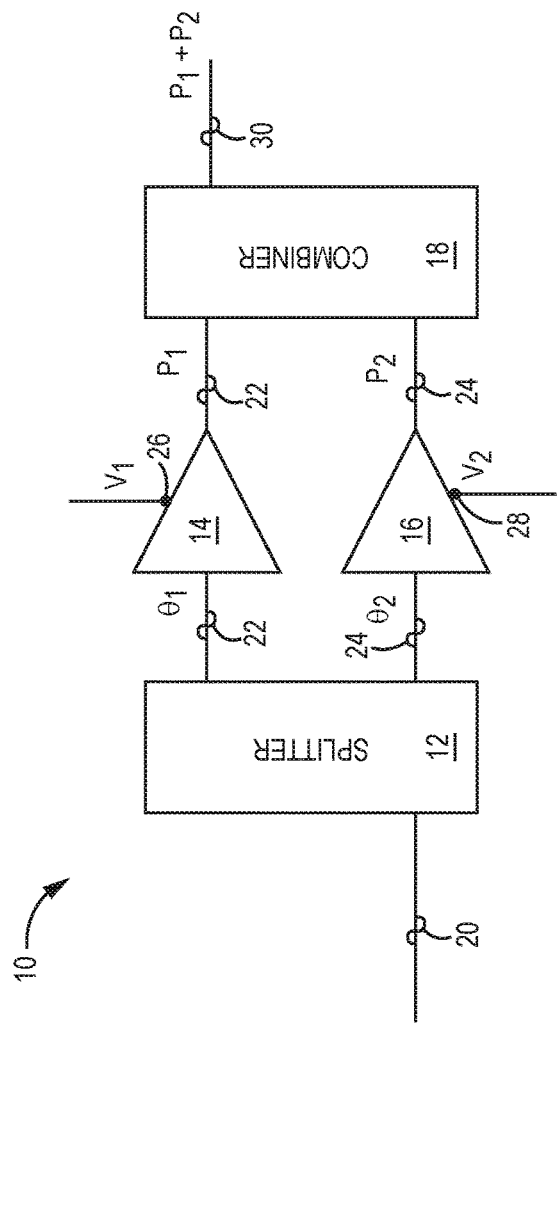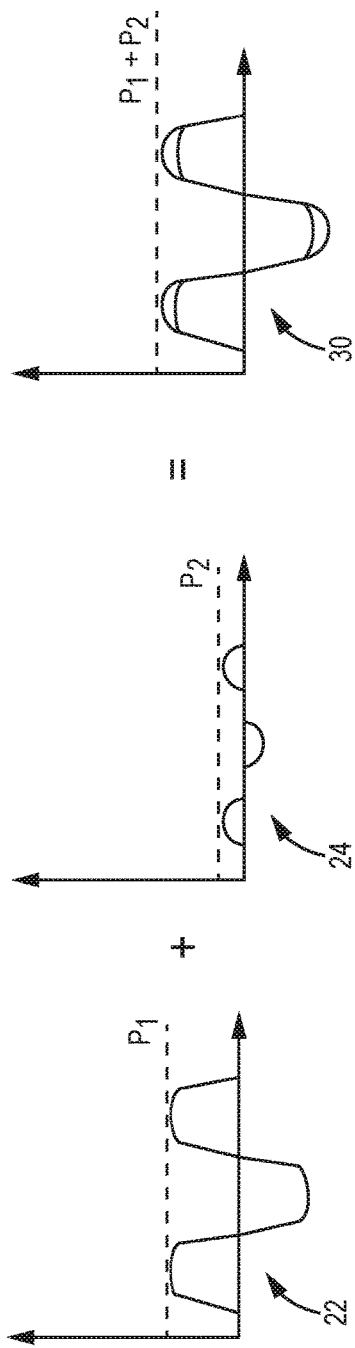
FIG. 1A
PRIOR ART
FIG. 1B
PRIOR ART

MULTI-MODE POWER MANAGEMENT SYSTEM SUPPORTING FIFTH-GENERATION NEW RADIO

RELATED APPLICATIONS

This application is a continuation of U.S. patent application Ser. No. 15/678,245, filed on Aug. 16, 2017, now U.S. Pat. No. 10,171,037, which claims the benefit of U.S. Provisional Patent Application Serial No. 62/489,727, filed on Apr. 25, 2017, the disclosures of which are incorporated herein by reference in their entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation (5G) new radio (NR) (5G-NR) wireless communication system has been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands, which include a low-band (below 1 GHz), a mid-band (1 GHz to 6 GHz), and a high-band (above 24 GHz).

A portion of the 5G-NR RF bands, particularly the low-band and the mid-band, overlaps with the RF bands currently used by the 3G and/or the 4G wireless communication systems. As such, the 5G-NR wireless communication system is designed to provide greater scalability across all the 5G-NR RF bands. For example, the 5G-NR wireless communication system can scale down to operate in the 3G/4G RF bands based on the 3G/4G wireless communication standard for lower throughput applications and/or in suburban locations, and scale up to operate in the 5G-NR RF bands based on the 5G-NR communication standard for higher throughput applications and/or in urban/indoor locations. As such, it may be desired for the 3G, 4G, and 5G-NR communication standards to coexist in the mobile communication devices.

SUMMARY

Embodiments of the disclosure relate to a multi-mode power management system supporting fifth-generation new radio (5G-NR). The multi-mode power management system includes first tracker circuitry and second tracker circuitry each capable of supplying an envelope tracking (ET) modulated or an average power tracking (APT) modulated voltage. In examples discussed herein, the first tracker circuitry and the second tracker circuitry have been configured to support third-generation (3G) and fourth-generation (4G) power amplifier circuits in various 3G/4G operation modes. The multi-mode power management system is adapted to further support a 5G-NR power amplifier circuit(s) in various 5G-NR operation modes (e.g., 5G-NR high power mode and 5G-NR low power mode) based on the existing first tracker circuitry and/or the existing second tracker circuitry. In this regard, the 5G-NR power amplifier circuit(s) can be incorporated into the existing multi-mode power management system with minimum hardware changes, thus enabling 5G-NR support without significantly increasing component count, cost, and footprint of the multi-mode power management system.

In one aspect, a multi-mode power management system is provided. The multi-mode power management system includes a power amplifier circuit configured to amplify a 5G-NR signal to an output power level for transmission in a 5G-NR band. The power amplifier circuit includes a carrier amplifier configured to amplify the 5G-NR signal to a first power level in response to receiving a first bias voltage at a first bias voltage input. The power amplifier circuit also includes a peaking amplifier configured to amplify the 5G-NR signal to a second power level in response to receiving a second bias voltage at a second bias voltage input. A sum of the first power level and the second power level equals the output power level. The multi-mode power management system also includes first tracker circuitry configured to generate a first voltage at a first voltage output. The multi-mode power management system also includes second tracker circuitry configured to generate a second voltage at a second voltage output. The multi-mode power management system also includes control circuitry. The control circuitry is configured to couple the first voltage output to the first bias voltage input and the second bias voltage input in a 5G-NR low power mode. The control circuitry is also configured to couple the first voltage output and the second voltage output to the first bias voltage input and the second bias voltage input, respectively, in a 5G-NR high power mode.

In another aspect, a multi-mode power management system is provided. The multi-mode power management system includes a power amplifier circuit configured to amplify a signal to an output power level. The power amplifier circuit includes a carrier amplifier configured to amplify the signal to a first power level in response to receiving a first bias voltage at a first bias voltage input. The power amplifier circuit also includes a peaking amplifier configured to amplify the signal to a second power level in response to receiving a second bias voltage at a second bias voltage input. A sum of the first power level and the second power level equals the output power level. The multi-mode power management system also includes first tracker circuitry configured to generate a first voltage at a first voltage output. The multi-mode power management system also includes second tracker circuitry configured to generate a second voltage at a second voltage output. The multi-mode power management system also includes control circuitry. The control circuitry is configured to couple the first voltage output to the first bias voltage input and the second bias voltage input in a low power mode. The control circuitry is also configured to couple the first voltage output and the second voltage output to the first bias voltage input and the second bias voltage input, respectively, in a high power mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 1A is a schematic diagram of an exemplary conventional Doherty power amplifier circuit;

FIG. 1B is a graph providing exemplary illustrations of signals generated in the conventional Doherty power amplifier circuit of FIG. 1A;

DETAILED DESCRIPTION

Figure 2A:
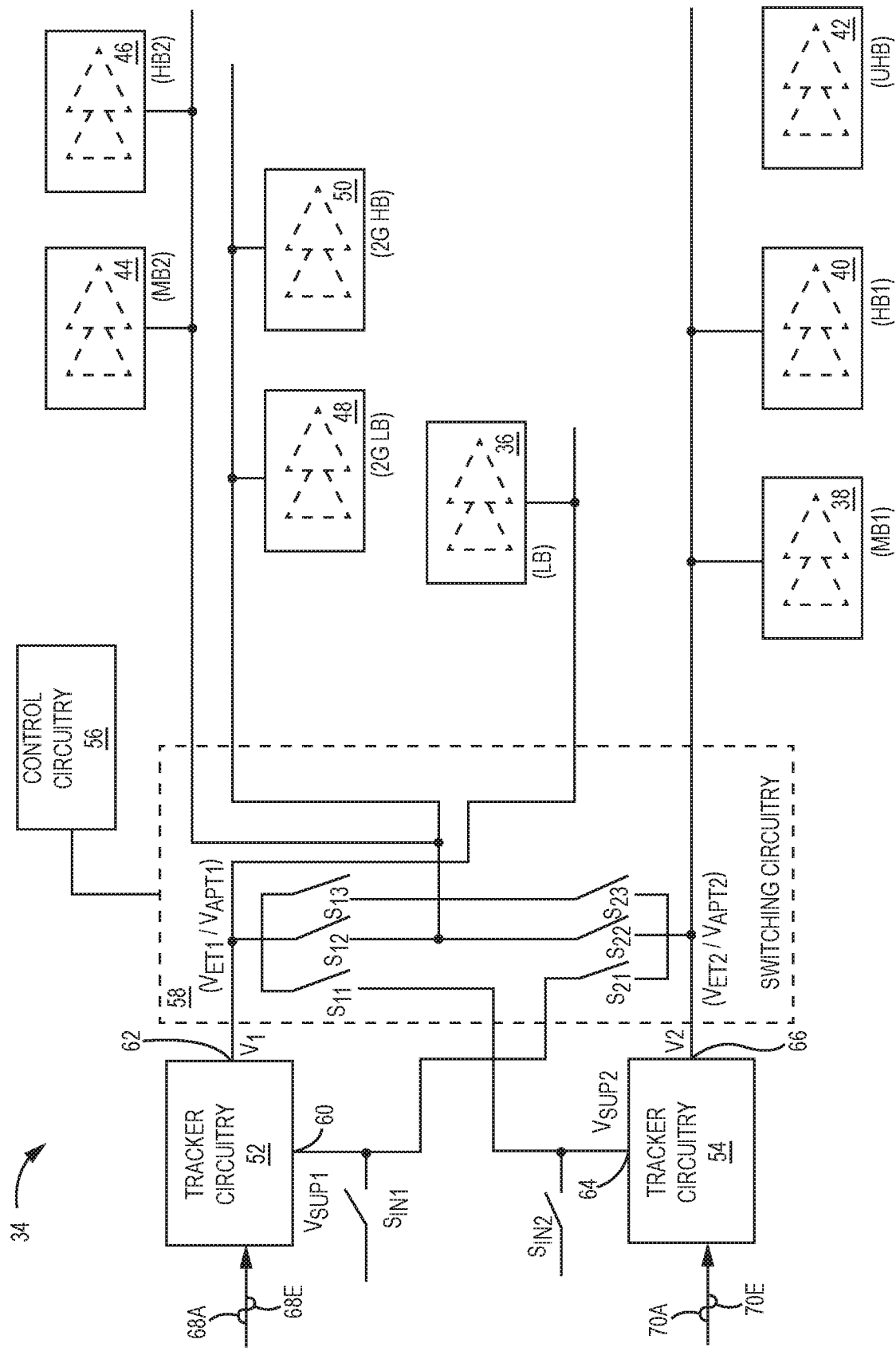
FIG. 2A is a schematic diagram of an exemplary existing multi-mode power management system that can be adapted to support various fifth-generation new radio (5G-NR) operation modes.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode power management system supporting fifth-generation new radio (5G-NR). The multi-mode power management system includes first tracker circuitry and second tracker circuitry each capable of supplying an envelope tracking (ET) modulated or an average power tracking (APT) modulated voltage. In examples discussed herein, the first tracker circuitry and the second tracker circuitry have been configured to support third-generation (3G) and fourth-generation (4G) power amplifier circuits in various 3G/4G operation modes. The multi-mode power management system is adapted to further support a 5G-NR power amplifier circuit(s) in various 5G-NR operation modes (e.g., 5G-NR high power mode and 5G-NR low power mode) based on the existing first tracker circuitry and/or the existing second tracker circuitry. In this regard, the 5G-NR power amplifier circuit(s) can be incorporated into the existing multi-mode power management system with minimum hardware changes, thus enabling 5G-NR support without significantly increasing component count, cost, and footprint of the multi-mode power management system.

In a non-limiting example, the 5G-NR power amplifier circuit(s) can be configured to function according to the functional principles of a Doherty power amplifier circuit. As such, before discussing exemplary aspects of a multi-mode power management system supporting a 5G-NR power amplifier circuit(s) in various 5G-NR operation modes, a brief overview of a conventional Doherty power amplifier circuit is first provided with reference to FIGS. 1A and 1B. A discussion of an existing multi-mode power management system already supporting various 3G and 4G operation modes, which can be adapted to support various 5G-NR operations modes is then provided with references to FIGS. 2A and 2B. The discussion of specific exemplary aspects of a multi-mode power management system supporting a 5G-NR power amplifier circuit(s) in various 5G-NR operation modes starts below with reference to FIG. 3.

FIG. 1A is a schematic diagram of an exemplary conventional Doherty power amplifier circuit 10. The most essential elements of the conventional Doherty power amplifier circuit 10 include a splitter 12, a carrier amplifier 14, a peaking amplifier 16, and a combiner 18. The splitter 12 receives an input signal 20 and splits the input signal 20 into a first signal 22 and a second signal 24. The first signal 22 has a first phase $\theta_1$. The second signal 24 has a second phase $\theta_2$, which is a ninety-degree) (90°) offset from the first phase $\theta_1$.

The carrier amplifier 14 is configured to amplify the first signal 22 up to a first peak power $P_1$ in response to receiving a first bias voltage $V_1$ at a first bias voltage input 26. The first peak power $P_1$ is the maximum power level the carrier amplifier 14 can linearly produce before reaching a respective compression point and losing linearity.

The peaking amplifier 16 is configured to amplify the second signal 24 up to a second peak power $P_2$ in response to receiving a second bias voltage $V_2$ at a second bias voltage input 28. The peak power $P_2$ is the maximum power level the peaking amplifier 16 can linearly produce before reaching a respective compression point and losing linearity.

The combiner 18 is configured to combine the first signal 22 and the second signal 24 to generate an output signal 30, which has a peak power that equals $P_1+P_2$. In this regard, the second peak power $P_2$ may be considered a "top-up" power to the first peak power $P_1$, as is further illustrated below in FIG. 1B.

In this regard, FIG. 1B is a graph 32 providing exemplary illustrations of the first signal 22, the second signal 24, and the output signal 30 generated in the conventional Doherty power amplifier circuit 10 of FIG. 1A. As shown in FIG. 1B, the first signal 22 has a first peak power $P_1$, the second signal 24 has the second peak power $P_2$, and the output signal 30 has the peak power $P_1+P_2$.

FIG. 2A is a schematic diagram of an exemplary existing multi-mode power management system 34 that can be adapted to support various 5G-NR operation modes. The existing multi-mode power management system 34 includes a low-band (LB) power amplifier circuit 36, a first mid-band (MB) power amplifier circuit 38, a first high-band (HB) power amplifier circuit 40, an ultra-high-band (UHB) power amplifier circuit 42, a second MB power amplifier circuit 44, a second HB power amplifier circuit 46, a second-generation (2G) LB power amplifier circuit 48, and a 2G HB power amplifier circuit 50.

In a non-limiting example, the LB power amplifier circuit 36 is configured to amplifier a 3G signal, such as a wideband code division multiple access (WCDMA) signal, and/or a 4G signal, such as a long-term evolution (LTE) signal, for transmission in a 450-960 MHz band. As such, the LB power amplifier circuit 36 may be configured to function as a WCDMA LB power amplifier circuit or an LTE LB power amplifier circuit.

Each of the first MB power amplifier circuit 38 and the second MB power amplifier circuit 44 is configured to amplify the 3G signal and/or the 4G signal for transmission in a 1710-2200 MHz band. Accordingly, each of the first MB power amplifier circuit 38 and the second MB power amplifier circuit 44 is configured to function as a WCDMA MB power amplifier circuit and/or an LTE MB power amplifier circuit.

Each of the first HB power amplifier circuit 40 and the second HB power amplifier circuit 46 is configured to amplify the 3G signal and/or the 4G signal for transmission in a 2300-2700 MHz band. Accordingly, each of the first HB power amplifier circuit 40 and the second HB power amplifier circuit 46 is configured to function as a WCDMA HB power amplifier circuit and/or an LTE HB power amplifier circuit.

The UHB power amplifier circuit 42 is configured to amplifier the 3G signal and/or the 4G signal for transmission in a 3400-3800 MHz band. As such, the UHB power amplifier circuit 42 may be configured to function as a WCDMA UHB power amplifier circuit or an LTE UHB power amplifier circuit.

The 2G LB power amplifier circuit 48 is configured to amplifier a 2G signal, such as a WCDMA signal, and/or a 4G signal, such as global system for mobile communication (GSM) and enhanced data rates for GSM evolution (EDGE). Notably, the existing multi-mode power management system 34 may also include other types of power amplifier circuits, such as Wi-Fi 2.4 GHz and 5 GHz power amplifier circuits, which are omitted for the sake of simplicity.

The existing multi-mode power management system 34 includes first tracker circuitry 52, second tracker circuitry 54, control circuitry 56, and switching circuitry 58. The switching circuitry 58 includes a plurality of first switches $S_{11}$-$S_{13}$ and a plurality of second switches $S_{21}$-$S_{23}$. The first tracker circuitry 52 is configured to receive a first supply voltage $V_{SUP1}$ at a first supply voltage input 60 and generate a first voltage $V_1$ at a first voltage output 62 based on the first supply voltage $V_{SUP1}$. The first tracker circuitry 52 may receive the first supply voltage $V_{SUP1}$ from an internal voltage source, such as a low dropout regulator (LDO), or from the second tracker circuitry 54, which can provide a higher voltage than the internal voltage source. To provide the first supply voltage $V_{SUP1}$ to the first tracker circuitry 52 from the internal voltage source, a first input switch $S_{IN1}$ is closed, while the second switch $S_{21}$ is open. In contrast, to provide the first supply voltage $V_{SUP1}$ to the first tracker circuitry 52 from the second tracker circuitry 54, the second switch $S_{21}$ is closed, while the first input switch $S_{IN1}$ is open.

The second tracker circuitry 54 is configured to receive a second supply voltage $V_{SUP2}$ at a second supply voltage input 64 and generate a second voltage $V_2$ at a second voltage output 66 based on the second supply voltage $V_{SUP2}$. The second tracker circuitry 54 may receive the second supply voltage $V_{SUP2}$ from the internal voltage source or from the first tracker circuitry 52. To provide the second supply voltage $V_{SUP2}$ to the second tracker circuitry 54 from the internal voltage source, a second input switch $S_{IN2}$ is closed, while the first switch $S_{11}$ is open. In contrast, to provide the second supply voltage $V_{SUP2}$ to the second tracker circuitry 54 from the first tracker circuitry 52, the first switch $S_{11}$ is closed, while the second input switch $S_{IN2}$ is open.

The first tracker circuitry 52 can generate the first voltage $V_1$ as a first envelope tracking (ET) modulated voltage $V_{ET1}$ in response to receiving a first ET modulation signal 68E or generate the first voltage $V_1$ as a first average power tracking (APT) modulated voltage $V_{APT1}$ in response to receiving a first APT modulation signal 68A. The second tracker circuitry 54 can generate the second voltage $V_2$ as a second ET modulated voltage $V_{ET2}$ in response to receiving a second ET modulation signal 70E or generate the second voltage $V_2$ as a second APT modulated voltage $V_{APT2}$ in response to receiving a second APT modulation signal 70A.

The first switches $S_{11}$-$S_{13}$ and the second switches $S_{21}$-$S_{23}$ are configured to selectively couple the first voltage output 62 and/or the second voltage output 66 to provide a bias voltage(s) to one or more power amplifier circuits among the LB power amplifier circuit 36, the first MB power amplifier circuit 38, the first HB power amplifier circuit 40, the UHB power amplifier circuit 42, the second MB power amplifier circuit 44, the second HB power amplifier circuit 46, the 2G LB power amplifier circuit 48, and the 2G HB power amplifier circuit 50. The control circuitry 56 controls the first switches $S_{11}$-$S_{13}$ and the second switches $S_{21}$-$S_{23}$ to support various 2G, 3G, and/or 4G operation modes.

In one example, the existing multi-mode power management system 34 can configure a selected power amplifier circuit among the LB power amplifier circuit 36, the first MB power amplifier circuit 38, the first HB power amplifier circuit 40, the UHB power amplifier circuit 42, the second MB power amplifier circuit 44, and the second HB power amplifier circuit 46 to support a 3G/4G ET single transmit (ET-STX) mode operation, such as a WCDMA ET-STX mode operation and/or an LTE ET-STX mode operation. For example, to configure the second tracker circuitry 54 and the first MB power amplifier circuit 38 in the 3G/4G ET-STX mode operation, the control circuitry 56 provides the second ET modulation signal 70E to the second tracker circuitry 54 and configures the first tracker circuitry 52 to output the second voltage $V_2$ as the second ET modulated voltage $V_{ET2}$ at the second voltage output 66. The control circuitry 56 further configures the first tracker circuitry 52 to generate the first voltage $V_1$ as the first APT modulated voltage $V_{APT1}$ at the first voltage output 62. Accordingly, the control circuitry 56 opens the second switch $S_{21}$ and closes the first input switch $S_{IN1}$ to provide the first supply voltage $V_{SUP1}$ to the first tracker circuitry 52 from the internal voltage source. In addition, the control circuitry 56 opens the second input switch $S_{IN2}$ and closes the first switch $S_{11}$ to provide the second supply voltage $V_{SUP2}$ to the second tracker circuitry 54 from the first tracker circuitry 52. As such, the first MB power amplifier circuit 38 can amplify a 3G signal (e.g., WCDMA signal) or a 4G signal (e.g., LTE signal) based on the ET modulated voltage $V_{ET1}$ for transmission in the 3G/4G ET-STX mode. It should be appreciated that it is also possible to configure the first tracker circuitry 52 and the first MB power amplifier circuit 38 in the 3G/4G ET-STX mode operation by adding switches and/or changing switch layout in the switching circuitry 58.

In another example, the existing multi-mode power management system 34 can configure a selected power amplifier circuit among the LB power amplifier circuit 36, the first MB power amplifier circuit 38, the first HB power amplifier circuit 40, the UHB power amplifier circuit 42, the second MB power amplifier circuit 44, and the second HB power amplifier circuit 46 to support a 3G/4G APT single transmit (APT-STX) mode operation. For example, to configure the second tracker circuitry 54 and the first MB power amplifier circuit 38 in the 3G/4G APT-STX mode operation, the control circuitry 56 provides the second APT modulation signal 70A to the second tracker circuitry 54 and configures the second tracker circuitry 54 to output the second voltage $V_2$ as the second APT modulated voltage $V_{APT2}$ at the second voltage output 66. The control circuitry 56 turns off the first tracker circuitry 52. Accordingly, the control circuitry 56 opens the first switch $S_{11}$ and closes the second input switch $S_{IN2}$ to provide the second supply voltage $V_{SUP2}$ to the second tracker circuitry 54 from the internal voltage source. As such, the first MB power amplifier circuit 38 can amplify a 3G signal (e.g., WCDMA signal) or a 4G signal (e.g., LTE signal) based on the APT modulated voltage $V_{APT2}$ for transmission in the 3G/4G APT-STX mode. It should be appreciated that it is also possible to configure the first tracker circuitry 52 and the first MB power amplifier circuit 38 in the 3G/4G APT-STX mode operation by adding switches and/or changing switch layout in the switching circuitry 58.

In another example, the existing multi-mode power management system 34 can configure two selected power amplifier circuits among the LB power amplifier circuit 36, the first MB power amplifier circuit 38, the first HB power amplifier circuit 40, the UHB power amplifier circuit 42, the second MB power amplifier circuit 44, and the second HB power amplifier circuit 46 to support a 3G/4G ET dual transmit (ET-DTX) mode operation, such as a WCDMA ET-DTX mode operation and/or an LTE ET-DTX mode operation. For example, to configure the first tracker circuitry 52, the second tracker circuitry 54, the first MB power amplifier circuit 38, and the second HB power amplifier circuit 46 in the 3G/4G ET-DTX mode operation, the control circuitry 56 provides the first ET modulation signal 68E and the second ET modulation signal 70E to the first tracker circuitry 52 and the second tracker circuitry 54, respectively. The control circuitry 56 couples the first voltage output 62 of the first tracker circuitry 52 to the second HB power amplifier circuit 46 by closing the first switch $S_{12}$. As such, the second HB power amplifier circuit 46 can amplify a 3G signal (e.g., WCDMA signal) or a 4G signal (e.g., LTE signal) based on the ET modulated voltage $V_{ET1}$ for transmission in the HB, while the first MB power amplifier circuit 38 amplifying the 3G signal (e.g., WCDMA signal) or the 4G (e.g., LTE signal) based on the ET modulated voltage $V_{ET2}$ for transmission in the MB.

The existing multi-mode power management system 34 may be further configured to support other operation modes, such as 2G-STX mode and 2G-DTX mode by selectively coupling the first tracker circuitry 52 and/or the second tracker circuitry 54 via the switching circuitry 58. Notably, the switching circuitry 58 is provided herein merely as a non-limiting example and should not be interpreted as being limiting. In other words, the switching circuitry 58 can be constructed based on any number, type, and layout of switches.

Each of the LB power amplifier circuit 36, the first MB power amplifier circuit 38, the first HB power amplifier circuit 40, the UHB power amplifier circuit 42, the second MB power amplifier circuit 44, the second HB power amplifier circuit 46, the 2G LB power amplifier circuit 48, and the 2G HB power amplifier circuit 50 may be configured to include at least one serial power amplifier circuit as discussed next in FIG. 2B.

Figure 2B:
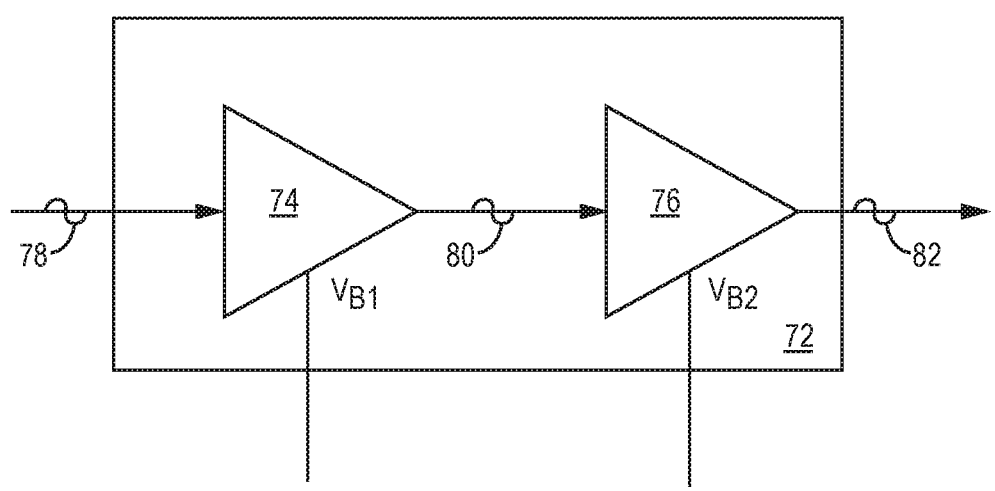
FIG. 2B is a schematic diagram of an exemplary serial power amplifier circuit that can be provided in the existing multi-mode power management system of FIG. 2A for amplifying second-generation (2G), third-generation (3G), and/or fourth-generation (4G) signals.

FIG. 2B is a schematic diagram of an exemplary serial power amplifier circuit 72 that can be provided in the existing multi-mode power management system 34 of FIG. 2A for amplifying 2G, 3G, and/or 4G signals. The serial power amplifier circuit 72 includes a driver stage power amplifier 74 and an output stage power amplifier 76 connected in tendon. The driver stage power amplifier 74 is configured to amplify a signal 78 (e.g., WCDMA signal, LTE signal, etc.) to generate a driver stage signal 80. The output stage power amplifier 76 is configured to further amplify the driver stage signal 80 to generate an output signal 82 (e.g., WCDMA signal, LTE signal, etc.). The driver stage power amplifier 74 and the output stage power amplifier 76 are configured to operate based on bias voltages $V_{B1}$ and $V_{B2}$, respectively. The bias voltages $V_{B1}$ and $V_{B2}$ may be provided by the first tracker circuitry 52 and/or the second tracker circuitry 54 of FIG. 2A.

The existing multi-mode power management system 34 of FIG. 2A can be adapted to create a new multi-mode power management system for supporting a 5G-NR power amplifier circuit(s) in various 5G-NR operation modes. As further discussed below, the 5G-NR power amplifier circuit(s) can be supported by the first tracker circuitry 52 and the second tracker circuitry 54. As such, it is possible to incorporate the 5G-NR power amplifier circuit into the existing multi-mode power management system 34 with minimum hardware additions, thus help to reduce component count, cost, and footprint of the new multi-mode power management system. In addition, the new multi-mode power management system can still support all the power amplifier circuits (2G/3G/4G) in LB/MB/HB/UHB as described above in FIGS. 2A and 2B. As such, the new multi-mode power management system is backward compatible with the existing multi-mode power management system 34.

Figure 3:
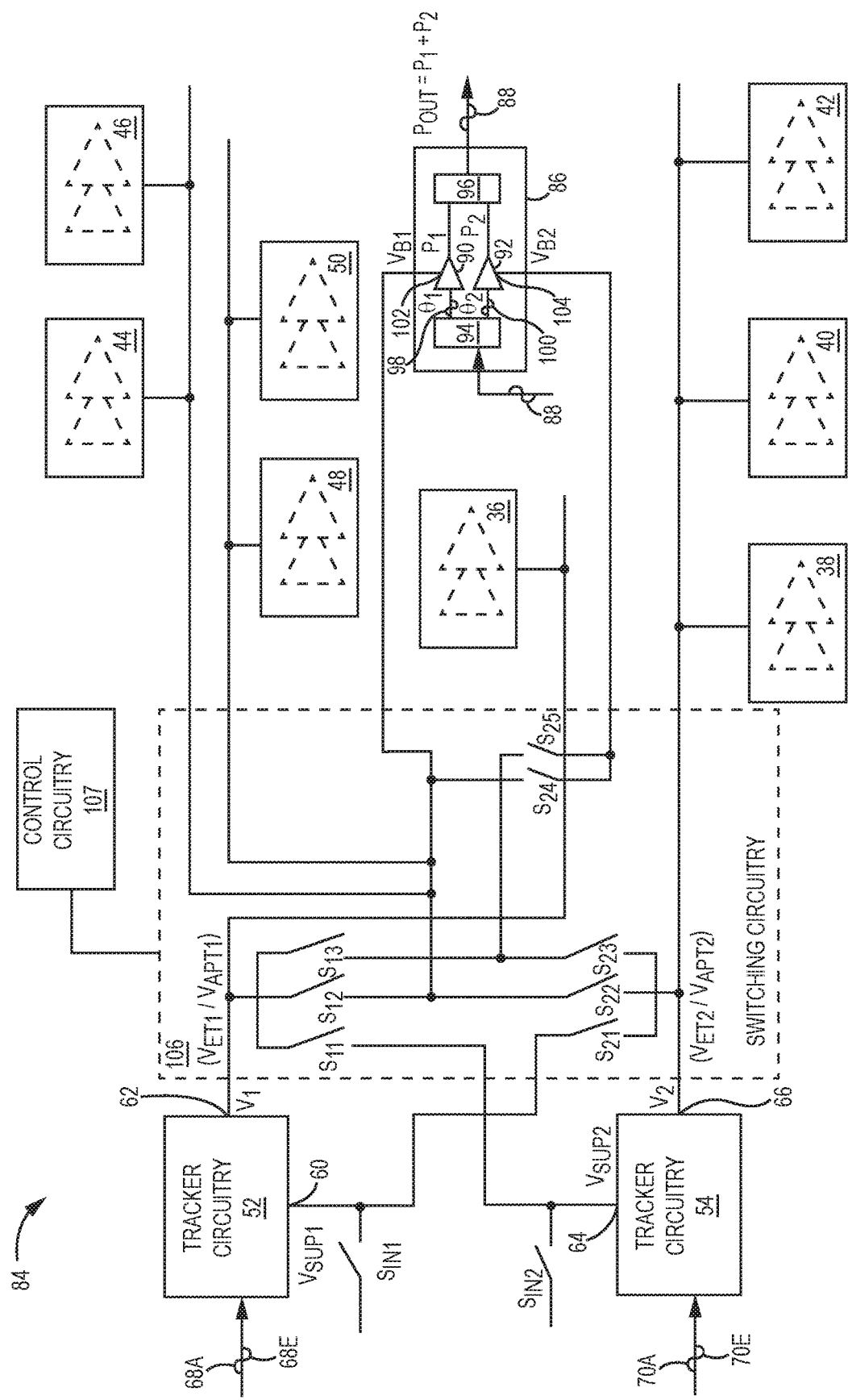
FIG. 3 is a schematic diagram of an exemplary multi-mode power management system, which is adapted from the existing multi-mode power management system of FIG. 2A, for supporting various fifth-generation new radio (5G-NR) operation modes.

In this regard, FIG. 3 is a schematic diagram of an exemplary multi-mode power management system 84, which is adapted from the existing multi-mode power management system 34 of FIG. 2A, for supporting various 5G-NR operation modes. Common elements between FIGS. 2A and 3 are shown therein with common element numbers and will not be re-described herein. In the examples discussed herein, the term 5G-NR refers to a wireless communication technology defined by the third-generation partnership project (3GPP) in LTE Release 15 (Rel-15) and beyond.

The multi-mode power management system 84 includes a power amplifier circuit 86 configured to amplify a 5G-NR signal 88 to an output power level $P_{OUT}$ for transmission in a 5G-NR band. In a non-limiting example, the power amplifier circuit 86 is a Doherty-like power amplifier circuit including a carrier amplifier 90, a peaking amplifier 92, a splitter 94, and a combiner 96.

The splitter 94 splits the 5G-NR signal 88 into a first signal 98 and a second signal 100. The first signal 98 has a first phase $\theta_1'$. The second signal 100 has a second phase $\theta_2'$, which is a 90° offset from the first phase $\theta_1'$. The carrier amplifier 90 is configured to amplify the first signal 98 to a first power level $P_1$ in response to receiving a first bias voltage $V_{B1}$ at a first bias voltage input 102. The peaking amplifier 92 is configured to amplify the second signal 100 to a second power level $P_2$ in response to receiving a second bias voltage $V_{B2}$ at a second bias voltage input 104. The combiner 96 combines the first signal 98 and the second signal 100 to generate the 5G-NR signal 88 at the output power level $P_{OUT}$, which equals a sum of the first power level $P_1$ and the second power level $P_2$ ($P_{OUT}=P_1+P_2$).

The multi-mode power management system 84 reuses the first tracker circuitry 52 and the second tracker circuitry 54 from the existing multi-mode power management system 34. The first tracker circuitry 52 and the second tracker circuitry 54 generate the first voltage $V_1$ at the first voltage output 62 and the second voltage $V_2$ at the second voltage output 66, respectively. The multi-mode power management system 84 includes switching circuitry 106. In a non-limiting example, the switching circuitry 106 includes a plurality of first switches $S_{11}$-$S_{13}$ and a plurality of second switches $S_{21}$-$S_{25}$. Among the switches in the switching circuitry 106, the first switches $S_{11}$-$S_{13}$ are equivalent to the first switches $S_{11}$-$S_{13}$ in the switching circuitry 58 and the second switches $S_{21}$-$S_{23}$ are equivalent to the second switches $S_{21}$-$S_{23}$ in the switching circuitry 58. Notably, the switching circuitry 106 is provided herein merely as a non-limiting example and should not be interpreted as being limiting. In other words, the switching circuitry 106 can be constructed based on any number, type, and layout of switches.

The power amplifier circuit 86 may be configured to support a 5G-NR low power mode operation and a 5G-NR high power mode operation. In examples discussed herein, control circuitry 107 may determine whether to operate the multi-mode power management system 84 in the 5G-NR low power mode or the 5G-NR high power mode based on a power threshold. In one non-limiting example, if the output power level of the 5G-NR signal 88 is less than or equal to the power threshold, the multi-mode power management system 84 operates in the 5G-NR low power mode. Otherwise, the multi-mode power management system 84 operates in the 5G-NR high power mode. In another non-limiting example, if peak-to-average ratio (PAR) of the output power level of the 5G-NR signal 88 is less than or equal to the power threshold, the multi-mode power management system 84 operates in the 5G-NR low power mode. Otherwise, the multi-mode power management system 84 operates in the 5G-NR high power mode.

In the 5G-NR low power mode, the control circuitry 107 can selectively couple one of the first voltage output 62 and the second voltage output 66 to the power amplifier circuit 86 for providing the first bias voltage $V_{B1}$ and the second bias voltage $V_{B2}$ to the carrier amplifier 90 and the peaking amplifier 92. For example, in the 5G-NR low power mode, the control circuitry 107 provides the first APT modulation signal 68A to the first tracker circuitry 52 to generate the first output voltage $V_1$ as the first APT modulated voltage $V_{APT1}$. The control circuitry 107 can close the switch $S_{12}$ to couple the first voltage output 62 of the first tracker circuitry 52 to the first bias voltage input 102 of the carrier amplifier 90. In addition, the control circuitry 107 also closes the switch $S_{24}$ to couple the first voltage output 62 to the second bias voltage input 104 of the peaking amplifier 92. Accordingly, the first tracker circuitry 52 is providing the first bias voltage $V_{B1}$ and the second bias voltage $V_{B2}$ to the carrier amplifier 90 and the peaking amplifier 92, respectively.

Continuing with the example above, since the first tracker circuitry 52 is supplying both the first bias voltage $V_{B1}$ and the second bias voltage $V_{B2}$, the second tracker circuitry 54 is freed up to support other power amplifier circuits in the multi-mode power management system 84. In this regard, the second tracker circuitry 54 can be configured to concurrently support another power amplifier circuit in the multi-mode power management system 84. In one example, the second tracker circuitry 54 can be configured to generate the second voltage $V_2$ as the second APT modulated voltage $V_{APT2}$. The control circuitry 107 may couple the second voltage output 66 of the second tracker circuitry 54 to a LTE power amplifier circuit (e.g., the first MB power amplifier circuit 38) for amplifying an LTE signal. Alternatively, the control circuitry 107 may couple the second voltage output 66 of the second tracker circuitry 54 to a WCDMA power amplifier circuit (e.g., the second MB power amplifier circuit 44) for amplifying a WCDMA signal.

In the 5G-NR high power mode, the control circuitry 107 couples the first voltage output 62 of the first tracker circuitry 52 and the second voltage output 66 of the second tracker circuitry 54 to the first bias voltage input 102 of the carrier amplifier 90 and the second bias voltage input 104 of the peaking amplifier 92, respectively. For example, in the 5G-NR high power mode, the control circuitry 107 provides the first APT modulation signal 68A to the first tracker circuitry 52 to generate the first output voltage $V_1$ as the first APT modulated voltage $V_{APT1}$. The control circuitry 107 also provides the second APT modulation signal 70A to the second tracker circuitry 54 to generate the second output voltage $V_2$ as the second APT modulated voltage $V_{APT2}$. The control circuitry 107 can close the switch $S_{12}$ to couple the first voltage output 62 of the first tracker circuitry 52 to the first bias voltage input 102 of the carrier amplifier 90. The control circuitry 107 also closes the switch $S_{23}$ and the switch $S_{25}$ to couple the second voltage output 66 to the second bias voltage input 104 of the peaking amplifier 92.

The multi-mode power management system 84 is configured to be backward compatible with the existing multi-mode power management system 34 in terms of supporting the 2G, 3G, and 4G power amplifier circuits in various operation modes. In this regard, the multi-mode power management system 84 can support the 3G/4G ET-STX mode, the 3G/4G APT-STX mode, the 3G/4G ET-DTX mode, and the 3G/4G APT DTX mode as previously discussed in reference to FIG. 2A.

Figure 4:
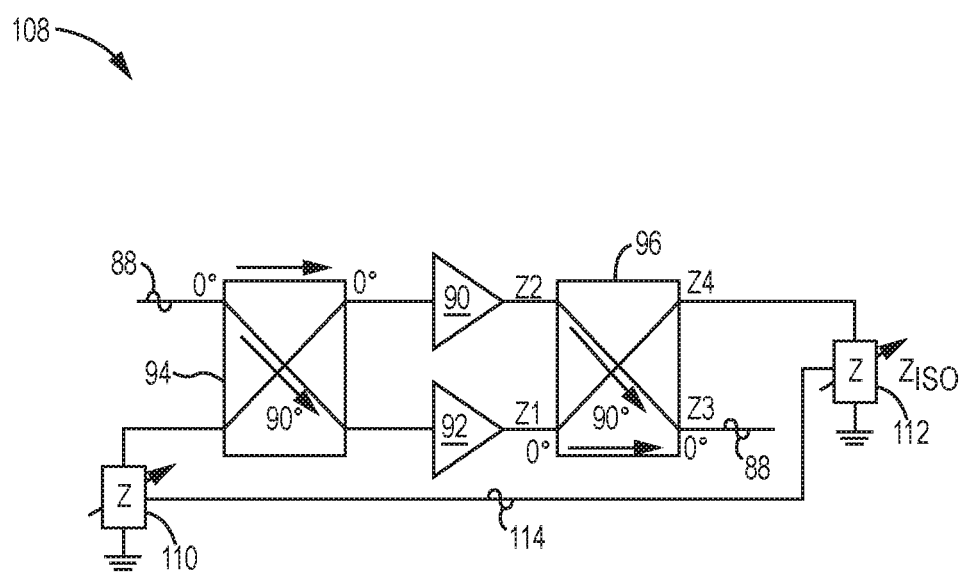
FIG. 4 is a schematic diagram of an exemplary reconfigurable load modulation power amplifier circuit that may be provided in the multi-mode power management system of FIG. 3 for supporting the various 5G-NR operations.

In a non-limiting example, the power amplifier circuit 86 can be provided as a reconfigurable load modulation power amplifier circuit, as discussed next in FIG. 4. In this regard, FIG. 4 is a schematic diagram of an exemplary reconfigurable load modulation power amplifier circuit 108 that may be provided in the multi-mode power management system 84 of FIG. 3 for supporting the various 5G-NR operations. Common elements between FIGS. 3 and 4 are shown therein with common element numbers and will not be re-described herein.

The reconfigurable load modulation power amplifier circuit 108 includes an input impedance tuning network 110 coupled between the splitter 94 and a ground. The reconfigurable load modulation power amplifier circuit 108 also includes an output impedance tuning network 112 coupled between the combiner 96 and the ground. The input impedance tuning network 110 and the output impedance tuning network 112 are continuously controlled by a control signal 114. As such, impedance at an isolation part of the splitter 94 and the combiner 96 is tunable such that at least one of the carrier amplifier 90 and the peaking amplifier 92 is presented with a quadrature load impedance that ranges from around about half an output load termination impedance to around about twice the output load termination impedance. For more details about the reconfigurable load modulation power amplifier circuit 108, please refer to U.S. patent application Ser. No. 14/501,453, now U.S. Pat. No. 9,484,865, issued on Nov. 1, 2016, titled "RECONFIGURABLE LOAD MODULATION AMPLIFIER."

Figure 5:
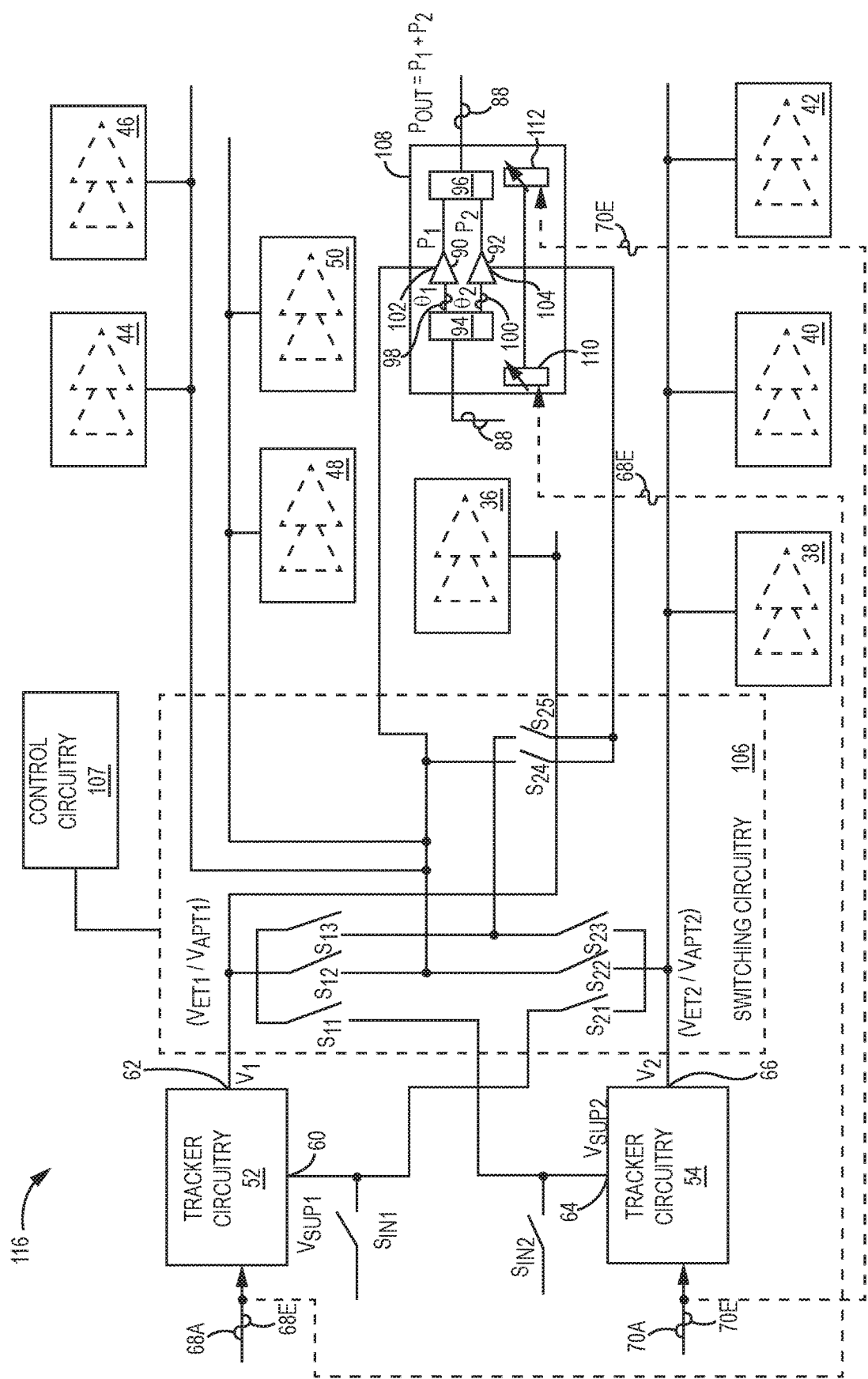
FIG. 5 is a schematic diagram of an exemplary multi-mode power management system incorporating the reconfigurable load modulation power amplifier circuit of FIG. 4.

The reconfigurable load modulation power amplifier circuit 108 can be incorporated into the multi-mode power management system 84 of FIG. 3. In this regard, FIG. 5 is a schematic diagram of an exemplary multi-mode power management system 116 incorporating the reconfigurable load modulation power amplifier circuit 108 of FIG. 4. Common elements between FIGS. 3, 4, and 5 are shown therein with common element numbers and will not be re-described herein.

Notably, the difference between the multi-mode power management system 116 and the multi-mode power management system 84 of FIG. 3 is that the reconfigurable load modulation power amplifier circuit 108 of FIG. 4 is provided in place of the power amplifier circuit 86 of FIG. 3. As such, the multi-mode power management system 116 is compatible with the multi-mode power management system 84 of FIG. 3. Accordingly, the multi-mode power management system 116 can support all the operation modes as described in FIG. 3. In a non-limiting example, the input impedance tuning network 110 and the output impedance tuning network 112 can be controlled continuously by the first ET modulation signal 68E and the second ET modulation signal 70E, respectively.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode power management system comprising:
    a power amplifier circuit configured to amplify a fifth-generation new radio (5G-NR) signal to an output power level for transmission in a 5G-NR band, the power amplifier circuit comprising:
        a carrier amplifier configured to amplify the 5G-NR signal to a first power level in response to receiving a first bias voltage at a first bias voltage input; and
        a peaking amplifier configured to amplify the 5G-NR signal to a second power level in response to receiving a second bias voltage at a second bias voltage input;
    first tracker circuitry configured to generate a first voltage at a first voltage output; and
    control circuitry configured to couple the first voltage output to the first bias voltage input and the second bias voltage input in a 5G-NR low power mode.

2. The multi-mode power management system of claim 1 further comprising second tracker circuitry configured to generate a second voltage at a second voltage output, wherein the control circuitry is further configured to couple the first voltage output and the second voltage output to the first bias voltage input and the second bias voltage input, respectively, in a 5G-NR high power mode.

3. The multi-mode power management system of claim 2 wherein
    a sum of the first power level and the second power level equals the output power level.

4. The multi-mode power management system of claim 2 wherein the control circuitry is further configured to:
    operate in the 5G-NR low power mode in response to the output power level of the 5G-NR signal being less than or equal to a power threshold; and
    operate in the 5G-NR high power mode in response to the output power level of the 5G-NR signal being greater than the power threshold.

5. The multi-mode power management system of claim 2 further comprising switching circuitry, wherein the control circuitry is further configured to control the switching circuitry to:
    couple the first voltage output to the first bias voltage input and the second bias voltage input in the 5G-NR low power mode; and couple the first voltage output and the second voltage output to the first bias voltage input and the second bias voltage input, respectively, in the 5G-NR high power mode.

6. The multi-mode power management system of claim 2 wherein:
the first tracker circuitry is further configured to:
generate the first voltage as a first envelope tracking (ET) modulated voltage based on a first supply voltage received at a first supply voltage input in response to receiving a first ET modulation signal; and
generate the first voltage as a first average power tracking (APT) modulated voltage in response to receiving a first APT modulation signal; and
the second tracker circuitry is further configured to:
generate the second voltage as a second ET modulated voltage based on a second supply voltage received at a second supply voltage input in response to receiving a second ET modulation signal; and
generate the second voltage as a second APT modulated voltage in response to receiving a second APT modulation signal.

7. The multi-mode power management system of claim 6 wherein:
the first tracker circuitry is further configured to generate the first voltage as the first APT modulated voltage in the 5G-NR low power mode and the 5G-NR high power mode; and
the second tracker circuitry is further configured to generate the second voltage as the second APT modulated voltage in the 5G-NR high power mode.

8. The multi-mode power management system of claim 6 wherein the power amplifier circuit further comprises:
a splitter configured to split the 5G-NR signal into a first signal of a first phase and a second signal of a second phase having a ninety-degree offset from the first phase;
the carrier amplifier further configured to amplify the first signal to the first power level in response to receiving the first bias voltage at the first bias voltage input;
the peaking amplifier further configured to amplify the second signal to the second power level in response to receiving the second bias voltage at the second bias voltage input; and
a combiner configured to combine the first signal at the first power level and the second signal at the second power level to generate the 5G-NR signal at the output power level.

9. The multi-mode power management system of claim 8 wherein the power amplifier circuit further comprises an input impedance tuning network coupled to the splitter and an output impedance tuning network coupled to the combiner.

10. The multi-mode power management system of claim 9 wherein the control circuitry is further configured to control the input impedance tuning network and the output impedance tuning network via the first ET modulation signal and the second ET modulation signal, respectively.

11. The multi-mode power management system of claim 6 further comprising a long-term evolution (LTE) power amplifier circuit configured to amplify an LTE signal for transmission in an LTE band.

12. The multi-mode power management system of claim 11 wherein the control circuitry is further configured to couple the second voltage output to the LTE power amplifier circuit for amplifying the LTE signal in the 5G-NR low power mode.

13. The multi-mode power management system of claim 11 wherein the control circuitry is further configured to couple the first voltage output to provide the first voltage as the first APT modulated voltage to the LTE power amplifier circuit and turn off the second tracker circuitry in an LTE ET single transmit mode.

14. The multi-mode power management system of claim 11 wherein in an LTE ET single transmit mode, the control circuitry is further configured to:
couple the first voltage output to the LTE power amplifier circuit to provide the first voltage to the LTE power amplifier circuit as the first ET modulated voltage; and
couple the second voltage output to the first supply voltage input to provide the second voltage as the second APT modulated voltage to the first tracker circuitry.

15. The multi-mode power management system of claim 11 further comprising a second LTE power amplifier circuit configured to amplify the LTE signal for transmission in a second LTE band, wherein the control circuitry is further configured to couple the first voltage output and the second voltage output to the LTE power amplifier circuit and the second LTE power amplifier circuit, respectively, in an LTE dual transmit mode.

16. The multi-mode power management system of claim 6 further comprising a wideband code division multiple access (WCDMA) power amplifier circuit configured to amplify a WCDMA signal for transmission in a WCDMA band.

17. The multi-mode power management system of claim 16 wherein the control circuitry is further configured to couple the second voltage output to the WCDMA power amplifier circuit for amplifying the WCDMA signal in the 5G-NR low power mode.

18. The multi-mode power management system of claim 16 wherein the control circuitry is further configured to couple the first voltage output to provide the first voltage as the first APT modulated voltage to the WCDMA power amplifier circuit and turn off the second tracker circuitry in a WCDMA ET single transmit mode.

19. The multi-mode power management system of claim 16 wherein in a WCDMA ET single transmit mode, the control circuitry is further configured to:
couple the first voltage output to the WCDMA power amplifier circuit to provide the first voltage to the WCDMA power amplifier circuit as the first ET modulated voltage; and
couple the second voltage output to the first supply voltage input to provide the second voltage as the second APT modulated voltage to the first tracker circuitry.

20. The multi-mode power management system of claim 16 further comprising a second WCDMA power amplifier circuit configured to amplify the WCDMA signal for transmission in a second WCDMA band, wherein the control circuitry is further configured to couple the first voltage output and the second voltage output to the WCDMA power amplifier circuit and the second WCDMA power amplifier circuit, respectively, in a WCDMA dual transmit mode.

* * * * *